(12) United States Patent
Bringivijayaraghavan et al.

(10) Patent No.: US 9,400,602 B2
(45) Date of Patent: Jul. 26, 2016

(54) STACKED MEMORY DEVICE CONTROL

(71) Applicant: GLOBALFOUNDRIES INC., Grand Cayman (KY)

(72) Inventors: Venkatraghavan Bringivijayaraghavan, Tamilnadu (IN); Saurabh Chadha, Bangalore (IN); Abhijit Saurabh, Bihar (IN); Saravanan Sethuraman, Bangalore (IN); Kenneth L. Wright, Austin, TX (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 66 days.

(21) Appl. No.: 14/464,090

(22) Filed: Aug. 20, 2014

(65) Prior Publication Data

US 2015/0331767 A1 Nov. 19, 2015

Related U.S. Application Data

(63) Continuation of application No. 14/276,025, filed on May 13, 2014.

(51) Int. Cl.
*G06F 3/00* (2006.01)
*G06F 3/06* (2006.01)
(Continued)

(52) U.S. Cl.
CPC ............... *G06F 3/06* (2013.01); *G06F 3/0617* (2013.01); *G06F 3/0659* (2013.01); *G06F 3/0688* (2013.01); *G06F 11/0727* (2013.01); *G06F 11/1666* (2013.01); *G06F 11/20* (2013.01);
(Continued)

(58) Field of Classification Search
CPC ............ G06F 11/2092; G06F 11/0727; G06F 11/1666; G06F 11/3027; G06F 11/3034; G06F 3/0617; G06F 3/0659; G06F 3/0688; G06F 13/1684; G06F 13/287; G06F 13/4068; G06F 11/20; G06F 11/2017; G06F 3/06; G11C 5/06; G11C 5/148
See application file for complete search history.

(56) References Cited

U.S. PATENT DOCUMENTS 5,347,428 A 9/1994 Carson et al.
5,973,392 A 10/1999 Senba et al.
(Continued)

FOREIGN PATENT DOCUMENTS

WO 2012034034 A1 3/2012

OTHER PUBLICATIONS

Chadha, S. et al., "Data Retrieval From Stacked Computer Memory," Filed May 13, 2014.
(Continued)

*Primary Examiner* — Bryce Bonzo
*Assistant Examiner* — Anthony J Amoroso
(74) *Attorney, Agent, or Firm* — Thompson Hine LLP

(57) ABSTRACT

A system for memory device control may include a stacked memory device and a memory controller. The stacked memory device may include a stack of chips connected to a package substrate by electrical interconnects. The stack may include a plurality of memory chips, a primary control chip, and a secondary control chip. The primary and secondary control chips may be electrically connected to the plurality of memory chips by an internal data bus. The primary control chip may have logic to provide an interface between the internal data bus and a first external data bus. The secondary control chip may have logic to provide an interface between the internal data bus and a second external data bus.

5 Claims, 5 Drawing Sheets

(51) Int. Cl.
    *G11C 5/14*     (2006.01)
    *G11C 5/06*     (2006.01)
    *G06F 11/16*     (2006.01)
    *G06F 11/07*     (2006.01)
    *G06F 11/30*     (2006.01)
    *G06F 13/40*     (2006.01)
    *G06F 13/16*     (2006.01)
    *G06F 13/28*     (2006.01)
    *G06F 11/20*     (2006.01)

(52) U.S. Cl.
    CPC ........ *G06F 11/2017* (2013.01); *G06F 11/2092* (2013.01); *G06F 11/3027* (2013.01); *G06F 11/3034* (2013.01); *G06F 13/1684* (2013.01); *G06F 13/287* (2013.01); *G06F 13/4068* (2013.01); *G11C 5/06* (2013.01); *G11C 5/148* (2013.01)

(56) References Cited

U.S. PATENT DOCUMENTS

| | | | |
|---|---|---|---|
| 7,590,024 | B2 | 9/2009 | Kang |
| 7,809,873 | B2 | 10/2010 | Perry et al. |
| 8,031,505 | B2 | 10/2011 | Kang et al. |
| 8,059,443 | B2 | 11/2011 | McLaren et al. |
| 8,471,362 | B2 | 6/2013 | Lee |
| 2004/0257886 | A1* | 12/2004 | Adams .................. G11C 29/70 365/200 |
| 2012/0195137 | A1 | 8/2012 | Yun et al. |
| 2012/0299194 | A1 | 11/2012 | Lee et al. |
| 2013/0031418 | A1 | 1/2013 | Bellofatto et al. |
| 2013/0051165 | A1 | 2/2013 | Byeon |
| 2013/0148402 | A1 | 6/2013 | Chang et al. |
| 2013/0176763 | A1* | 7/2013 | Ware .................. G11C 29/808 365/51 |

OTHER PUBLICATIONS

IBM, "Logic Partitioning in VLSI Chips to Improve Failure Analysis", IP.com Prior Art Database Technical Disclosure, IP.com No. IPCOM000059803D, (Original Publication: Jan. 1, 1986, TDB 01-86 p. 3702-3703), Electronic Publication: Mar. 8, 2005. http://ip.com/IPCOM/000059803.

IBM, "Means of Increasing Yield on Logic Chips", IP.com Prior Art Database Technical Disclosure, IP.com No. IPCOM000103077D, (Original Publication: Jun. 1, 1990, Research Disclosure n314 06-90), Electronic Publication: Mar. 17, 2005. http://ip.com/IPCOM/000103077.

Kinsley, T., "DDR4 Module Level Trends and Features," Micron Technology, JEDEC, Global Standards for the Microelectronics Industry, Server Memory Forum 2011.

Bringivijayaraghavan et al., "Stacked Memory Device Control", U.S. Appl. No. 14/276,025, filed May 13, 2014.

List of IBM Patents or Patent Applications Treated as Related.

U.S. Patent and Trademark Office, Office Action issued in corresponding U.S. Appl. No. 14/276,025 dated Jan. 4, 2016.

U.S. Patent and Trademark Office, Notice of Allowance issued in corresponding U.S. Appl. No. 14/276,025 dated Apr. 26, 2016.

* cited by examiner

STACKED MEMORY DEVICE CONTROL

BACKGROUND

The present disclosure relates to stacked memory devices, more particular aspects relate to enabling access to data stored in the stacked memory device in the event of failure of a primary control chip.

Three dimensional circuit stacking may improve bandwidth, save space, and improve power consumption efficiency between two or more integrated circuits or other suitable computer components stacked in a package. A memory device may be constructed as a three dimensional circuit stack which may provide benefits of three dimensional circuit stacking to memory devices. Data held by the memory device may be lost in the event of component failure in a memory control chip.

SUMMARY

According to embodiments of the present disclosure a system for memory device control may include a stacked memory device. The stacked memory device may include a package substrate configured for placement on a circuit board, a stack of chips connected to the package substrate by electrical interconnects. The stack may include a plurality of memory chips each having one or more memory storage devices, a primary control chip, and a secondary control chip. The primary control chip may be electrically connected to the plurality of memory chips by an internal data bus, and may have logic to provide an interface between the internal data bus and a first external data bus. The secondary control chip may be electrically connected to the plurality of memory chips by the internal data bus, and may have logic to provide an interface between the internal data bus and a second external data bus.

The system may further include a memory controller electrically connected to the primary control chip and the secondary control chip and configured to identify an error condition in the primary control chip and enable the secondary control chip in response to identifying the error condition in the primary control chip. The memory controller may be further configured to disable the primary control chip in response to identifying the error condition in the primary control chip. The memory controller may be configured to enable the secondary control chip after disabling the primary control chip in response to identifying the error condition in the primary control chip. The secondary control chip may be further configured to provide an interface between the internal data bus and the first external data bus.

The primary control chip, the secondary control chip, and the plurality of memory chips may be electrically connected using through silicon vias. The secondary control chip may be positioned in the stack of chips above the plurality of memory chips and the primary control chip, and wherein the secondary control chip may be electrically connected to the package substrate using wire bonds.

The plurality of memory chips may be positioned in the stack of chips between the primary control chip and the secondary control chip. The secondary control chip may provide an interface between the internal data bus and the second external data bus using a serial interface. The serial interface may be an inter-integrated circuit interface connection. And the secondary control chip may include a parallel to serial conversion module electrically connected to the plurality of memory chips and to the internal data bus.

The stacked memory device of claim may further include a multiplexing device electrically connected to the primary control chip and the secondary control chip, the multiplex device may be configured to transmit signals to the primary control chip and secondary control chip based on determining that an error condition has occurred in the primary control chip.

A method for accessing data stored in a stacked memory device may include identifying an error condition in a primary control chip of the stacked memory device. The method may include disabling, in response to identifying the error condition in the primary control chip, the primary control chip using a memory controller coupled to the stacked memory device. The method may include enabling, in response to identifying the error condition, the secondary control chip using the memory controller. The method may include retrieving data stored on the stacked memory device using the secondary control chip. The method may include transmitting, to the memory controller, the data stored in the plurality of memory chips using a serial interface in the secondary control chip. And the method may include retrieving data from the plurality of memory chips in response to determining that the secondary control chip contains insufficient logic to continue operation of the stacked memory device.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
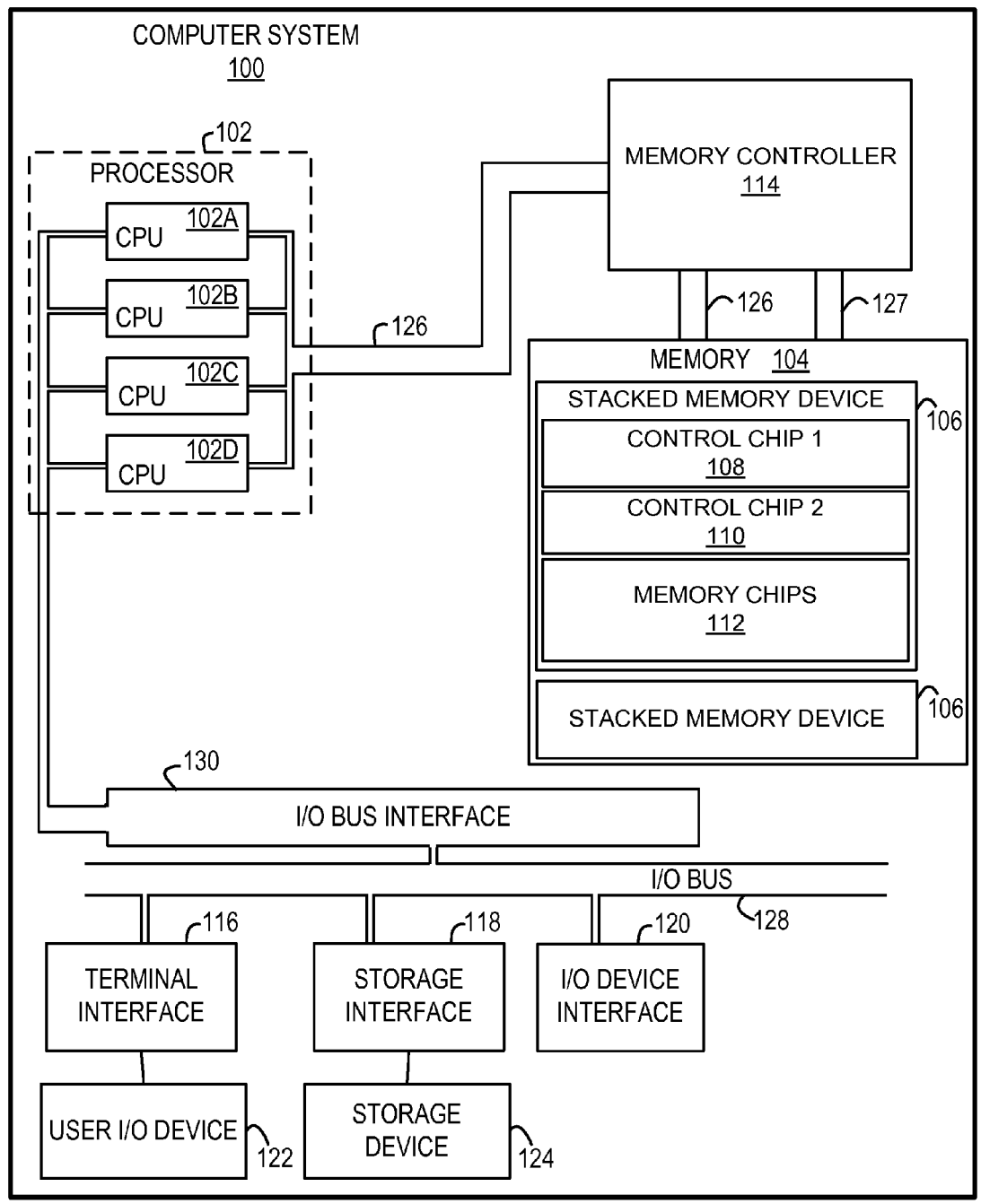
FIG. 1 depicts a system of memory device control according to various embodiments.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present disclosure relate to stacked memory devices, more particular aspects relate to enabling access to data stored in the stacked memory device, such as stacked DRAM devices, in the event of a problem or failure of a primary control chip. While the present disclosure is not necessarily limited to such applications, various aspects of the disclosure may be appreciated through a discussion of various examples using this context.

While the same nomenclature and same numbers may be used to identify elements throughout the disclosure, this practice is not intended to limit the scope of the disclosure. Identified elements in one figure may not be identical to other same named or identified elements in other figures.

Embodiments of the present disclosure are directed toward a stacked memory device with multiple stacked memory chips and a primary controller chip that provides access to the stacked memory chips by an external device. For example, the external device can be a memory controller device located at another location on a printed circuit board (PCB), relative to the memory device. The memory device can also include a secondary controller chip that is configured to provide access to the stacked memory chips in the event that a problem is detected in the primary controller chip. This can be particularly useful for protecting against data loss, as may occur if the primary controller chip has problems providing access memory stored in the stacked memory device.

Consistent with aspects of the present disclosure, a memory device can use a separate, dedicated chip as secondary controller. The use of a separate chip can facilitate access to data stored on the stacked memory chips by allowing for additional and/or redundant logic to be included. Moreover, by including logic in the secondary controller chip, the primary controller chip to be designed to function with or without the secondary controller chip included in the memory device. This can allow a manufacturer to use the same primary controller chip for devices either with or without the secondary controller chip.

To improve bandwidth, save space, and improve power consumption efficiency, two or more integrated circuits (chips), or other suitable computer components, may be stacked upon one another to create a three dimensional package. The improved power efficiency, bandwidth, and space savings may result from reducing wire connections between the chips, in comparison to unstacked, electrically connected chips. Instead of transmitting signals between chips using wired connections, such as large high power high speed links, three dimensional chips may transmit signals up and down a stack using electrical interconnects. Electrical interconnects may include through-silicon-via (TSV) or TSV interconnects, wirebonds, and other packaging connections such as C4 interconnects. These electrical interconnects may be used to electrically connect the components of the stacked memory device. For example, the plurality of memory chips, the primary control chip, and the secondary control chip may be connected together using a combination of TSV interconnects and solder bump/pads. As discussed herein, the stacked orientation and corresponding use of electrical interconnections to a single primary controller chip can result in the primary controller chip being a single point of failure that can be subject to a variety of different potential failures. Various embodiments are directed toward the use of a second controller chip that is designed to allow access to the stacked memory in the presence of such failures.

For example, a memory device may be constructed using three dimensional circuit configurations into a three dimensional memory stack. Such a memory device may be referred to herein as a stacked memory device. The stacked memory device may have plurality of memory chips and a primary control chip. The plurality of memory chips may store data, while the primary control chip may contain logic to control the memory chips in the stacked memory device. The primary control chip may contain logic to execute read/write commands, which may allow access to data in the memory chips and may allow for new data to be stored within the memory chips. In embodiments, the primary control chip and the plurality of memory chips may be arranged in a master/slave configuration, where the plurality of memory chips may be slave memory chips and the control chip may be a master chip. In such a configuration, the functionality of whole stacked memory device may be tied to the master chip and the master chip may provide unidirectional control over the slave memory chips. Should a failure occur in the master chip, portions of a slave memory chip or all of the slave memory chips may be prevented from communicating with a computer system. Data stored in the stacked memory device may become corrupted due to an inability to refresh the cells of memory storage devices in the slave chip, or may merely become inaccessible because a read/write I/O driver in the master chip experiences a failure. In embodiments, the memory storage devices may be volatile memory, such as DRAM, non-volatile memory, or other suitable storage medium. The master chip may coordinate communication between the stacked memory device and components outside the stacked memory device. While the control chip and the plurality of memory chips may be arranged in a master/slave configuration, other types of suitable communication models may be used. Consistent with embodiments of the present disclosure, a secondary controller chip can be designed to provide alternative access mechanisms to the stored data and to prevent corruption of the stored data.

As described herein, data held by the plurality of memory chips may be lost in case of failure of the control chip. The control chip may fail for various reasons including component failure, software errors, damage due to radiation, or other reasons. In the event of failure of the control chip, data stored in the memory chips may be lost unless a mechanism is available to salvage the data or which may replace the control chip and continue some level of functionality in the stacked memory device. By adding an additional or secondary control chip to the stacked memory device data may be retrieved. For example, data could be salvaged by transferring control over the stacked memory device to the secondary control chip in the event of primary control chip failure. This can provide a mechanism to retrieve data from the plurality of memory chips or to extend use of the stacked memory device in the event of control chip failure.

Consistent with embodiments, a system for memory device control may include a stacked memory device. The stacked memory device may include a package substrate configured for placement on a circuit board and a stack of chips connected to the package substrate by electrical interconnects. The stack may include a plurality of memory chips each having one or more memory storage devices, such as DRAM. The stack may include a primary control chip electrically connected to the plurality of memory chips by an internal data bus, and having logic to provide an interface between the internal data bus and a first external data bus. The stack may also include a secondary control chip electrically connected to the plurality of memory chips by the internal data bus, and having logic to provide an interface between the internal data bus and a second external data bus.

The system may also include a memory controller. The memory controller may be electrically connected to the primary control chip and the secondary control chip using a selection device and configured to identify an error condition in the primary control chip and enable the secondary control chip in response to identifying the error condition in the primary control chip.

Referring now to FIG. 1, a high level diagram representation of a computer system 100 may be seen according to embodiments of the present disclosure. The major components of the computer system 100 may include one or more processors 102, a main memory 104 including one or more stacked memory devices 106, a memory controller 114, a terminal interface 116, a storage interface 118, and an input/output (I/O) device interface 120, all of which may be communicatively coupled, directly or indirectly, for inter-component communication via a first external data bus 126 relative to the stacked memory device, a second external data bus 127 relative to the stacked memory device, an I/O bus 128, and an I/O bus interface unit 130.

The computer system 100 may contain one or more general-purpose programmable central processing units (CPUs) 102A, 102B, 102C, and 102D, herein generically referred to as the processor 102. In embodiments, the computer system 100 may contain multiple processors typical of a relatively large system. In certain embodiments the computer system 100 may be a single CPU system. Each processor 102 may execute instructions stored in the main memory 104 and may include one or more levels of on-board cache.

In embodiments, the main memory 104 may include a random-access semiconductor memory, storage device, or storage medium (either volatile or non-volatile) for storing or encoding data and programs. In certain embodiments, the main memory 104 may represent the entire virtual memory of the computer system 100, and may also include the virtual memory of other computer systems coupled to the computer system 100. The main memory 104 may be conceptually a single monolithic entity. In certain embodiments the main memory 104 may be a more complex arrangement, such as a hierarchy of caches and other memory devices.

The main memory 104 may include one or more stacked memory devices 106. Although the stacked memory devices 106 are illustrated as being contained within the main memory 104 in the computer system 100. In certain embodiments some or all of them may be on different computer systems and may be accessed remotely, e.g., via a network. The computer system 100 may use virtual addressing mechanisms that allow the programs of the computer system 100 to behave as if they only have access to a large, single storage entity instead of access to multiple and smaller stacked memory devices 106.

The stacked memory device 106 may include a primary control chip 108, a secondary control chip 110, and plurality of memory chips 112. The plurality of memory chips 112 may be stacked with the primary control chip 108 and the secondary control chip. The position of the primary control chip 108, secondary control chip 110, and plurality of memory chips 112 in the stack may vary in different embodiments. In embodiments, the plurality of memory chips 112 may be stacked on above of both the primary control chip 108 and the secondary control chip 110. In certain embodiments, the primary control chip 108 and the secondary control chip 110 may be positioned such that the plurality of memory chips 112 are sandwiched between the primary control chip 108 and the secondary control chip 110. In certain embodiments, the secondary control chip 110 may be positioned above the plurality of memory chips 112 and the primary control chip 108.

In embodiments, the primary control chip 108, the secondary control chip 110 and the plurality of memory chips 112 may be electrically connected by an internal data bus, relative to the stacked memory device 106, which allows for communication among the components of the stacked memory device 106. The internal data bus may connect the chips in the stacked memory device 106 using one or more solder bumps that electrically connects a pad on a chip to a TSV in another chip. As discussed herein, TSVs can penetrate through chips to allow connections between stacked chips. Some electrical connection solder bump and TSV connections may penetrate the entire stack, while others may penetrate through only a few chips in the stack. Thus, the internal data bus may convey electrical power and data to layers of the stacked computer memory device and may penetrate a few chips or the entire stack of chips in the stacked computer memory device.

The primary control chip 108 may provide logic or instructions to the plurality of memory chips 112 to carry out functions of the stacked memory device 106. The primary control chip 108 may be electrically connected to the plurality of memory chips 112 by an internal data bus, and have logic to provide an interface between the internal data bus and a first external data bus 126. The primary control chip 108 may execute read/write commands to read/write data in and out of memory storage devices in the plurality of memory chips 112. The data may be read in and out of the stacked memory device 106 to the first external data bus 126 and to the memory controller 114. The memory storage devices may store data and may be contained in the plurality of memory chips 112. In embodiments, the memory storage devices may be non-volatile memory, such as DRAM. In embodiments, in order to increase the memory capacity of the stacked memory device 106, the primary control chip 108 may also include memory storage devices. In some embodiments, the primary control chip 108 may issue read/write commands to the memory storage devices in the primary and secondary control chips 108, 110.

The primary control chip 108 may be individually enabled or disabled within the stacked memory device 106. Power gating techniques may be used to control individual power to the primary control chip 108. These power gating techniques may include using header switches, such as a p-type transistor, and/or footer switches to gate power on or power off logic latches in the primary control chip 108. In certain embodiments, power gating techniques may include enabling or disabling the clock signal to logic latches in the primary control chip 108 in order to enable or disable, respectively, the primary control chip 108. Other suitable power gating techniques may also be used. In embodiments, the power to the primary control chip 108 and the secondary control chip 110 may be controlled by the memory controller 114. The memory controller 114 may be configured to send commands to the primary or secondary control chips 108, 110 which may enable or disable the clock signal to the primary or secondary control chip 108, 110.

The primary control chip 108 may be configured to be disabled in response to detection of an error condition in the primary control chip 108. The error condition may be multiple types of errors in the primary control chip 108. In embodiments, the error condition may be caused by the failure of hardware components in the primary control chip 108 such as buffers, drivers, solder bump failure, memory storage devices, logic arrays, or other components in the primary control chip 108. In certain embodiments, the error conditions may be caused by electro migration in the primary control chip 108, power failure to components in the primary control chip 108, or other problems that interfere with the primary control chip 108's ability to execute a read or write command. Multiple components of the system 100 may be configured to identify the error condition in the primary control chip. In embodiments, the primary control chip 108 may be configured to determine whether a read or write command was executed properly, and in response to determining that the read or write command did not execute, determine that an error condition occurred in the primary control chip 108. In certain embodiments, the memory controller 114 or the secondary control chip 110 may be configured to determine whether an error condition occurred in the primary control chip 108.

The secondary control chip 110 may have backup logic or instructions to control the plurality of memory chips 112 and to carry out functions of the stacked memory device 106 in the event of problems or failure in the primary control chip 108. When enabled, the secondary control chip 110 may execute read/write commands to read/write data in or out of the plurality of memory chips 112 in the stacked memory device 106. The secondary control chip 110 may be electrically connected to the plurality of memory chips 112 by the internal data bus, and having logic to provide an interface between the internal data bus and a second external data bus. The secondary control chip 110 may issue read/write commands to memory storage devices in the stacked memory device 106. The memory storage devices may be contained in the plurality of memory chips 112. In some embodiments, in order to increase the memory capacity of the stacked memory device 106, the secondary control chip 110 may also include memory storage devices. In some embodiments, the secondary control chip 110 may issue read/write commands to the memory storage devices in the primary and secondary control chips 108, 110.

As described herein, the secondary control chip 110 may be activated in response to determining that an error condition has occurred in the primary control chip 108. The level of functionality provided by logic in the secondary control chip 110 may be sufficient to allow data to be accessed from the stacked memory device 106 so that data is not lost, stuck inside the stacked memory device 106, in the event of primary memory chip 108 failure. In embodiments, the secondary control chip may allow for interface between the internal data bus and the second external data bus 127 in the event of failure or problems in the primary control chip 108 so that data may be read out of the stacked memory device 106. This may allow for access to data in the stacked memory device 106 even in the event that access to the first external bus 126 through the primary control chip 108 is unavailable.

Consistent with embodiments, the logic contained in the secondary control chip 110 may provide a different level of functionality than the primary control chip 108. For example, the secondary control chip 110 may allow access to more memory chips 112 that is sufficient to read data from the plurality of memory chips 112 for retrieval purposes, but with less functionality than what is available from the primary control chip 108. This difference in functionality may include reduced memory throughput due to a slower external data bus (e.g., an I2C bus), reduced buffering, the inability to perform certain functions such as memory bursts and combinations thereof. In various embodiments, the secondary control chip may provide full functionality for the plurality of memory chips 112, so that normal operation of the stacked memory device 106 may occur using the secondary control chip 110. In embodiments, the secondary control chip 110 may perform the same or similar functions of the primary control chip and may allow for interface between the internal data bus and the first external data bus.

The secondary control chip 110 may be individually enabled or disabled within the stacked memory device 106. Power gating techniques may be used to control individual power to the secondary control chip 110. These power gating techniques may include using header switches, such as a p-type transistor, and/or footer switches to gate power on or power off logic latches in the secondary control chip 110. In certain embodiments, power gating techniques may include enabling or disabling the clock signal to logic latches in the secondary control chip 110 in order to enable or disable, respectively, the secondary control chip 110. Other suitable power gating techniques may also be used. The memory controller 114 may be configured to send commands to the primary or secondary control chips 108, 110 which may enable or disable the clock signal to the primary or secondary control chip 108, 110.

The secondary control chip 110 may be configured to maintain power and provide control functions over the stacked memory device 106 in response to detection of an error condition in the primary control chip 108. In connection with powering up, or enabling, the secondary control chip 110 the primary control chip 108 can be rendered quiescent by disabling the primary control chip 108. For example, the primary control chip 108 may be disabled using the power gating techniques described herein. By disabling the primary control chip 108 prior to enabling the secondary control chip 110, interference between command signals in the stacked memory device 106 may be reduced. However, the secondary control chip 110 may be enabled prior to (or without) powering down the primary control chip 108.

The control functions provided by the secondary control chip 110 may depend upon the logic contained in the secondary control chip 110. For instance, the secondary control chip 110 may be configured to provide access over a second external data bus 127 relative to the first data bus 126 used during normal operation. Further, the secondary control chip 110 may also be configured to provide access over a secondary/redundant internal data bus relative to the internal data bus in the stacked memory device 106 used during normal operation. Using one or more dedicated electrical interconnects data from the stacked memory device 106 can be retrieved. Consistent with certain embodiments, the secondary control chip 110 can be configured to use a slow, but reliable, data bus protocol. Particular, non-limiting examples, include a serial data bus protocols with data and clock interconnections (e.g., SMBus or I2C). The data interconnect may be used to transmit data out of the stacked memory device 106. In embodiments, data may be transmitted out of the stacked memory device on the second external data bus 127. The clock interconnect may be used to transmit a clock signal corresponding to data transmitting out of the stacked memory device 106. To accommodate differences in access speeds and data bus widths between the on chip memory bus and such serial data bus protocols, the secondary control chip 110 may have a parallel to serial conversion module which may convert data signals from the plurality of memory chips 112.

In order to accommodate the lower data access rates of the data interconnect relative to the on chip memory bus, the secondary control chip 110 may include a multiplexing unit that may be used in response to MRS commands from the memory controller 114 to sequentially access individual memory chips of the plurality of memory chips 112. When the secondary control chip 110 is used to retrieve data from the plurality of memory chips 112, the data may be sequentially accessed in individual memory chips using per DRAM addressability (PDA) to select and interact with individual DRAM devices on the plurality of memory chips 112.

The plurality of memory chips 112 may provide storage for data in the stacked memory device 106. In some embodiments, the plurality of memory chips 112 may include memory storage devices. The memory storage devices may be a volatile storage medium or non-volatile storage medium including a programmable gate array, DRAM, flash memory, or other suitable storage medium. Additionally, or in the alternative, the memory storage devices may be a system or cache memory, buffer space, or electrically or optically conductive devices and materials on which data may be transmitted and intermediately stored.

Memory controller 114 may facilitate the transfer of data between processor 102, storage device 124, primary control chip 108, secondary control chip 110, and the plurality of memory chips 112. The memory controller 114 may provide control of the stacked memory device 106 to issue commands to the primary control chip 108 and the secondary control chip 110. The memory controller 114 may issue read/write commands to the primary and secondary control chips 108, 110. The memory controller 114 may issue read/write commands in response to the request from the processor 102, or other component of the computer system 100. The memory controller 114 may include an address mapping table for mapping an address provided by the host into a physical address of memory storage devices in the plurality of memory chips 112 and in some embodiments, memory storage devices in the primary and secondary control chips 108, 110.

As described herein, the memory controller 114 may be configured to identify an error condition in the primary control chip 108 and enable the secondary control chip 110 in response to identifying the error condition in the primary control chip 108. In embodiments, the error condition may be caused by failure of hardware components in the primary control chip 108 such as buffers, drivers, solder bump failure, memory devices, logic arrays, or other components in the primary control chip 108. In certain embodiments, the error conditions may be caused by of electro migration in the primary control chip 108, power failure to components in the primary control chip 108, or other failure which causes failure of the primary control chip 108 to execute a read or write command. In some instances, the memory controller 114 may be configured to identify an error condition by determining whether a read or write command was executed properly in the primary control chip, and in response to determining that the read or write command did not execute, power down the primary memory chip 108.

The first external data bus 126 may provide a data communication path for transferring data among the processor 102, the memory controller 114, and the main memory 104. The second external data bus 127 may also provide a data communication path for data among the processor 102, the memory controller 114, and the main memory 104. The second external data bus, as described herein, may be connected to the secondary control chip 110 and may allow for interface between the internal data bus and the memory controller 114 through the secondary control chip 110. The I/O bus interface 130 may provide a data communication path for transferring data among the processor 102 and the I/O bus 128. The I/O bus interface 130 may be further coupled to the I/O bus 128 for transferring data to and from the various I/O units. The I/O bus interface unit 130 may communicate with multiple I/O interface units 116, 118, 120, 122, and 124, which may also be known as I/O processors (IOPs) or I/O adapters (IOAs), through the I/O bus 128.

The I/O interface units may support communication with a variety of storage and I/O devices. For example, the terminal interface unit 116 may support the attachment of one or more user I/O devices 122, which may include user output devices (such as a video display device, speaker, or television set) and user input devices (such as a keyboard, mouse, keypad, touchpad, trackball, buttons, light pen, or other pointing device). A user may manipulate the user input devices utilizing a user interface, in order to provide input data and commands to the user I/O device 122 and the computer system 100, and may receive output data via the user output devices. For example, a user interface may be presented via the user I/O device 122, such as displayed on a display device, played via a speaker, or printed via a printer.

The storage interface 118 supports the attachment of one or more disk drives or direct access storage devices 124. In certain embodiments, the storage device 124 may be implemented via any type of secondary storage device. The contents of the main memory 104, or a portion thereof, may be stored to and retrieved from the storage device 124 as needed. The I/O device interface 120 may provide an interface to any of various other input/output devices or devices of other types, such as printers or fax machines.

Figure 2:
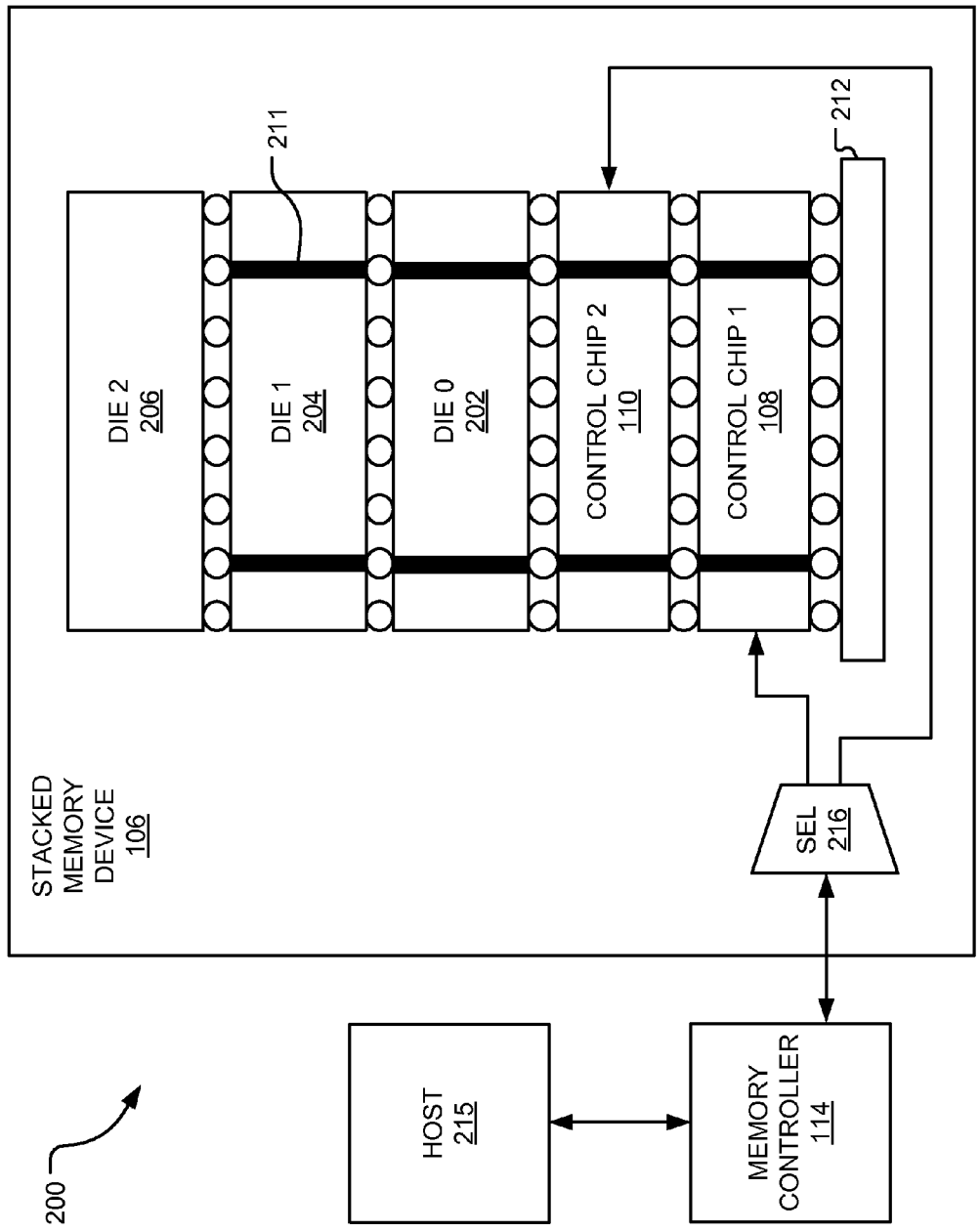
FIG. 2 depicts a detailed view of a stacked memory device according to various embodiments.

Referring now to FIG. 2, a system of memory device control may be seen according to various embodiments. The system 100 may include a stacked memory device 106 and a memory controller 114. The stacked memory device 106 may include a primary control chip 108, a secondary control chip 110, and plurality of memory chips 202, 204, 206.

As described herein, the primary control chip 108 may provide logic or instructions to the plurality of memory chips 202, 204, 206, to carry out functions of the stacked memory device 106. The primary control chip 108 may execute read/write commands to read/write data in and out of the plurality of memory chips 202, 204, 206, in the stacked memory device 106. The primary control chip 108 may issue read/write commands to memory storage devices in the stacked memory device 106.

The primary control chip 108 may be electrically connected to the plurality of memory chips 202, 204, 206, to the secondary control chip 110, and to a package substrate 212 by an internal data bus 211. The package substrate 212 may have opposing first and second faces and have electrical interconnects on the second face for electrical connection components of the stacked memory device 106. The primary control chip 108 may be positioned in a stack with the secondary control chip 110 and the plurality of memory chips 202, 204, 206. The stack may be positioned disposed on the second face of the package substrate and electrically connected to the electrical interconnects. In embodiments, the primary control chip 108 may be electrically connected with the plurality of memory chips 202, 204, 206, to the secondary control chip 110, and to the package substrate 212 using an internal data bus 211. The internal data bus 211 may be TSV connections between the chips. However, multiple types of electrical connections may be used in the between stacked chips including solder bumps, flip chip connections, wirebonds, and other suitable types of electrical connections. The primary control chip 108 may be electrically connected in the stacked memory device 106 using a serial interface such as an I$^2$C connection. The primary control chip 108 may be configured to interface data access between the plurality of memory chips 202, 204, 206, on the internal data bus 211 and a first external data bus.

The primary control chip 108 may be electrically connected to the memory controller 114. The primary control chip 108 may be enabled or disabled by control commands from memory controller 114. In response to an error condition being detected in the primary control chip, the memory controller 114 may transmit a control signal to primary control chip memory logic, which may respond by powering down the primary chip 108 as described herein. Described further herein, the memory controller 114 may then power up the secondary control chip 110 transfer control functions over the stacked memory device 106 to the secondary control chip 110 from the primary control chip 108. The memory controller 114 may access registers on the primary control chip 108 and the secondary control chip 110 which may control the clock signal to logic arrays in the primary and secondary control chips 108, 110. The memory controller 114 may send commands to the registers to enable or disable the primary and secondary control chip 108, 110. By powering down the primary control chip 108 prior to enabling the secondary control chip 110, interference between the primary and secondary control chip signals in the stacked memory device 106 may be reduced. In certain embodiments, the secondary control chip 110 may be enabled prior to powering down the primary control chip 108. The primary control chip 108 may be disabled using power gating techniques as described herein.

When enabled, the secondary control chip 110 may execute read/write commands to read/write data in or out of the plurality of memory chips 202, 204, 206, in the stacked memory device 106. The secondary control chip 110 may issue read/write commands to memory storage devices in the stacked memory device 106. The memory storage devices may be contained in the plurality of memory chips 202, 204, 206. In some embodiments, the secondary control chip 110 may also include memory storage devices. In some embodiments, the primary control chip 108 may issue read/write commands to the memory storage devices in the primary and secondary control chips 108, 110.

The secondary control chip 110 may have backup logic or instructions to control the plurality of memory chips 202, 204, 206, and to carry out functions of the stacked memory device 106. The logic contained in the secondary control chip 110 may provide a different level of functionality than the primary control chip 108. In certain embodiments, the secondary control chip 110 may include similar logic as the primary control chip 108 in order to provide the same level (or a similar level) of functionality as the primary control chip 108. When the secondary control chip 110 has the similar logic capabilities as the primary control chip 108, the secondary control chip 110 may act as a backup control chip for the stacked memory device 106, which may provide control over one or more functions of the primary control chip 108. In certain embodiments, the secondary control chip 110 may be configured to interface between the internal data bus 211 and the first external data bus 126 (FIG. 1). In certain embodiments, the secondary control chip 110 may be configured to interface between the internal data bus and a second external data bus 127 (FIG. 1). In certain embodiments, the secondary control chip 110 may contain logic sufficient to read out data from the stacked memory device 106.

The secondary control chip 110 may be electrically connected to the plurality of memory chips 202, 204, 206, to the primary control chip 108, and to the package substrate 212. The package substrate 212 may have opposing first and second faces and have electrical interconnects on the second face for electrical connection for components in the stacked memory device 106. The secondary control chip 110 may be disposed on the second face in the stack with the primary control chip 108 and the plurality of memory chips 202, 204, 206. In embodiments, the secondary control chip 110 may be electrically connected with the plurality of memory chips 202, 204, 206, to the primary control chip 108, and to the package substrate 212 using through silicon vias 211. However, multiple types of electrical connections may be used in between stacked chips including solder bumps, flip chip connections, wirebonds, and other suitable types of electrical connections. The secondary control chip 108 may also be electrically connected in the stacked memory device 106 using a serial interface such as an I²C connection.

The secondary control chip 110 may be electrically connected to the memory controller 114. The secondary control chip 110 may be enabled or disabled by control commands from memory controller 114. In response to an error condition being detected in the primary control chip, the memory controller 114 may transmit a control signal to primary control chip memory logic, which may respond by disabling the primary chip 108 as described herein. The memory controller 114 may also power up and enable the secondary control chip by transmitting a control signal to the secondary control chip 110. Upon being enabled, the secondary control chip 110 may assume control functions over the stacked memory device 106.

The plurality of memory chips 202, 204, 206, may be the same or substantially similar as the plurality of memory chips 112 (FIG. 1) described herein. The plurality of memory chips 202, 204, 206 may provide storage for data in the stacked memory device 106. In some embodiments, the plurality of memory chips 202, 204, 206, may include memory storage devices. The memory storage devices may be volatile storage, non-volatile storage, or other suitable storage medium.

The plurality of memory chips 202, 204, 206 may be electrically connected to the primary control chip 108, the secondary control chip 110, and to the package substrate 212. The package substrate 212 may have opposing first and second faces and have electrical interconnects on the second face. The plurality of memory chips 202, 204, 206 may be disposed on the second face in the stack with the primary control chip 108 and the secondary control chip 110. In embodiments, the plurality of memory chips 202, 204, 206 may be electrically connected with the secondary control chip 110, to the primary control chip 108, and to the package substrate 212 using an internal data bus 211, such as a TSV connection. However, multiple types of electrical connections may be used in between stacked chips including solder bumps, flip chip connections, wirebonds, and other suitable types of electrical connections.

The memory controller 114 may be the same or substantially similar as described herein. The memory controller 114 may facilitate the transfer of data between a host 215 and the plurality of memory chips 202, 204, 206. The memory controller 114 may provide control of the stacked memory device 106 to issue commands to the primary control chip 108 and the secondary control chip 110. The memory controller 114 may issue read/write commands to the primary and secondary control chips 108, 110. The memory controller 114 may issue read/write commands in response to the request from the host 215, such as a computer system. The memory controller 114 may include an address mapping table for mapping an address provided by the host into a physical address of memory storage devices in the plurality of memory chips 202, 204, 206 and in some embodiments, memory storage devices in the primary and secondary control chips 108, 110.

As described herein, the memory controller 114 may be configured to identify an error condition in the primary control chip 108. The memory controller 114 may transmit a control command to enable the secondary control chip 110 in response to identifying the error condition in the primary control chip 108. In embodiments, the error condition may be failure of hardware components in the primary control chip 108 such as buffers, drivers, solder bump failure, memory storage devices, logic arrays, or other components in the primary control chip 108. In certain embodiments, the error conditions may include detection of electro migration in the primary control chip 108, power failure to components in the primary control chip 108, or other failure which causes failure of the primary control chip 108 to execute a read or write command. The memory controller 114 may be configured to determine whether a read or write command was executed properly in the primary control chip, and in response to determining that the read or write command did not execute, disable the primary memory chip 108.

The memory controller 114 may be electrically connected to the primary control chip 108 and the secondary control chip 110 using a selection device 216. The selection device 216 may be a multiplexer, demultiplexer, multiple multiplexers, multiple demultiplexers, or a combination of multiplexers and demultiplexers. The selection device 216 may allow the memory controller 114 to communicate between the primary and secondary control chip 108, 110. In embodiments, in response to an error condition being detected in the primary control chip 108, the memory controller 114 may use the selection device 216 to transmit a control command to disable the primary control chip 108, and to transmit a control command to enable the secondary control chip 110. The selection device 216 may be located in the stacked memory device 106. In certain embodiments, the selection device 216 may be located in the memory controller 114 or other suitable location.

Figure 3:
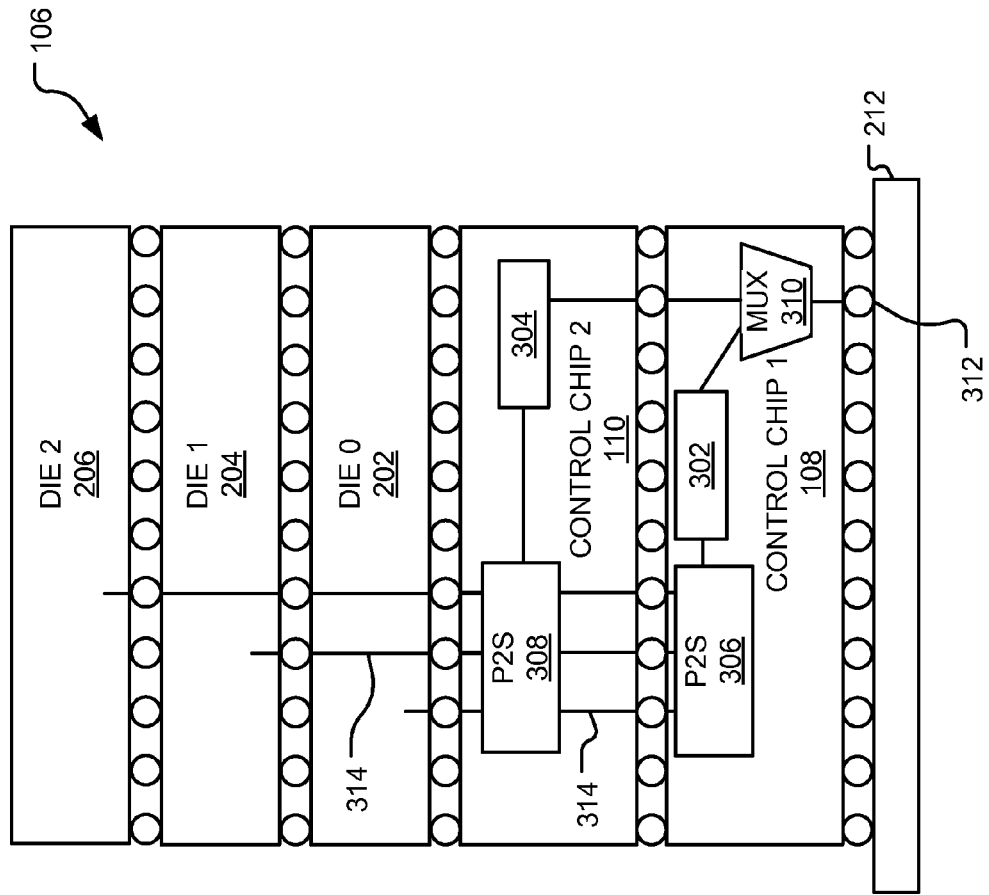
FIG. 3 depicts a detailed view of a stacked memory device having a serial interface according to various embodiments.

Referring now to FIG. 3 a stacked memory device configuration having a serial interface may be seen according to various embodiments of the present disclosure. As described herein, the serial interface may allow for transmission of data between the secondary control chip 110 and out to a second external data bus 126 (FIG. 1) relative to the stacked memory device 106. The stacked memory device may include a primary control chip 108, secondary control chip 110, and plurality of memory chips 202, 204, 206. The primary control chip 108 may include a parallel to serial conversion module 306, a serial interface 302 and a multiplex device 310. The secondary control chip 110 may include a parallel to serial conversion module 308 and a serial interface 304.

The primary control chip 108 and the secondary control chip may be the same or substantially similar as described herein. The plurality of memory chips 202, 204, 206 may be the same or substantially similar as described herein. The primary control chip 108 and the secondary control chip 110 may contain parallel to serial conversion modules 306, 308, and serial interface 302, 304. The primary control chip 108 may also contain multiplexing unit 310. The parallel to serial conversion modules 306, 308 may be connected to the plurality of memory chips 202, 204, 206, and to the serial interface 302, 304 by an internal data bus 314 in order to send and receive data between the plurality of memory chips 202, 204, 206 and the serial interface 302, 304. The parallel to serial conversion modules 306, 308 may each include a shift register which may modify the format of data inputs from the plurality of memory chips 202, 204, 206 from parallel to serial. The serial interface 302, 304 may facilitate communication in serial between elements of the stacked memory device 106 and to components in a computer system. In embodiments, the serial interface 302, 304 may be an inter integrated circuit ($I^2C$) connection.

The serial interface may be connected to multiplexing device 310. The multiplexing device 310 may allow for selection between the serial interface 302 in the primary control chip 108 and the serial interface 304 in the secondary control chip 110. The multiplexing device 310 may transfer data between either of the serial interfaces 302, 304 and the data retrieval connection 312. For example, the multiplexing unit 310 may be configured to transmit data to the serial interface 304 in the secondary control chip 110 in response to detection of the error condition in the primary control chip. The multiplexing unit 310 may be a multiplexer, demultiplexer, multiple multiplexers, multiple demultiplexers, or a combination of multiplexers and demultiplexers. The data retrieval connection 312 may be a soldered pin, wirebond connection, solder bump/pad, or other suitable type of connection. The data retrieval connection 312 may be a separate electrical connection from connections included within the stacked memory device 106. In embodiments, the data retrieval connection 312 may be used to retrieve data from the plurality of memory chips in the event of an error condition in the primary control chip 108. In certain embodiments, the data retrieval connection 312 may include two or more connections. For example the data retrieval connection 312 may include a data pin which is used to transmit data in serial, and a clock pin which is used to transmit the corresponding clock signal with the data transmission. In certain embodiments, the data retrieval connection 312 may be used in for purposes other than retrieval of data from the memory chips, such as utilizing the serial interface 302, 304 to communicate control or configuration data between the elements of the stacked memory device 106 and a computer system. The data retrieval connection 312 may be connected to the second external data bus 127 (FIG. 1) relative to the stacked memory device 106.

The parallel to serial conversion module 308, and serial interface 304 may be located in the secondary control chip 110 to improve likelihood of removal of data from the stacked memory device 106 in the event of failure of the primary control chip 108. For example, damage to components in the primary control chip 108 may impede transmission of data to the parallel to serial conversion module 306 and out through the data retrieval connection 312. By placing a parallel to serial conversion module 308 and serial interface 304 in the secondary control chip 110, data may be more reliably retrieved from the stacked memory device 106 in the event of primary control chip 108 failure.

Figure 4:
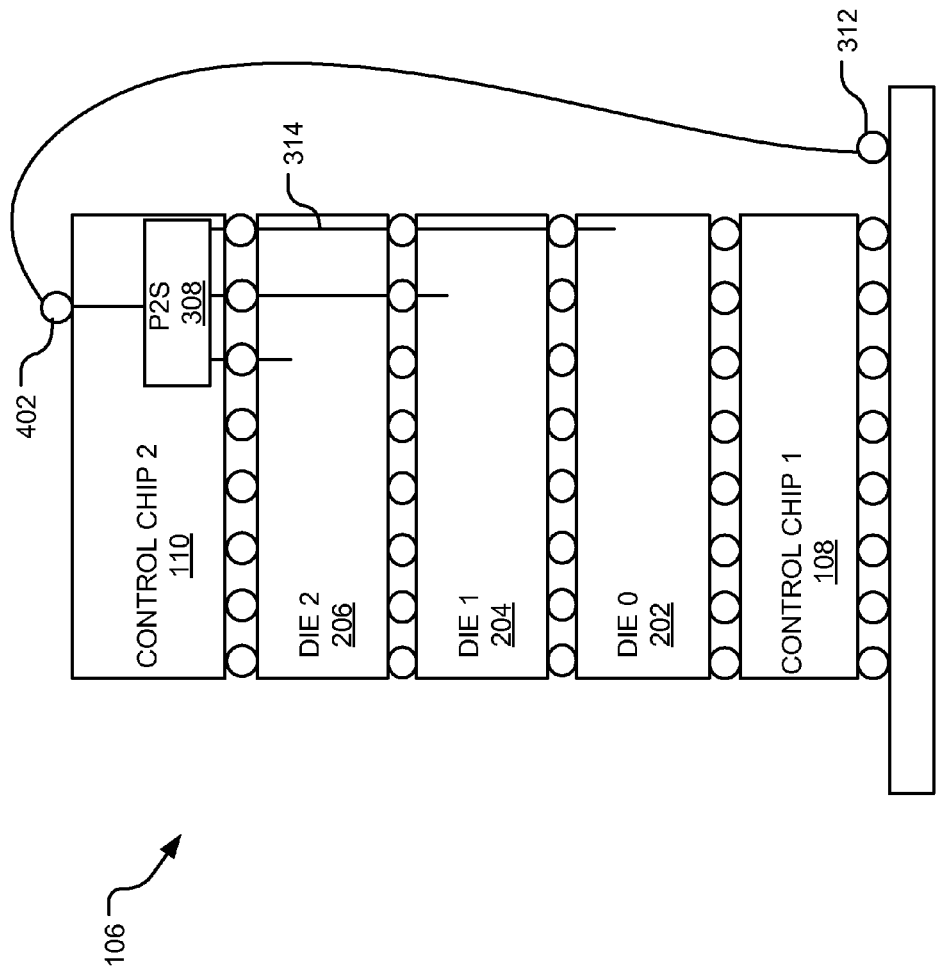
FIG. 4 depicts a detailed view of a stacked memory device having a wirebond connection to a package substrate according to various embodiments.

Referring now to FIG. 4 a stacked memory device configuration may be seen according to various embodiments of the present disclosure. The stacked memory device may include a primary control chip 108, secondary control chip 110, and plurality of memory chips 202, 204, 206. The secondary control chip may include a parallel to serial conversion module 306 connected to wirebond connection 402. The secondary control chip 110 and the primary control chip 108 may be positioned sandwiching the plurality of memory chips 202, 204, 206. The secondary control chip 110 may be positioned in the stack disposed on the primary control chip 108 and the plurality of memory chips 202, 204, 206. The wirebond connection may be connected to data retrieval connection 312. The positioning of the secondary control chip above the plurality of memory chips 202, 204, 206 may allow for communication outside of the stacked memory device even in the event of failure in the internal data bus. Further, the wirebond connection may allow for greater compatibility with circuit boards as it may not require additional pins in the stacked memory device compared to typical memory devices.

The secondary control chip 110 may include a parallel to serial conversion module 308 which may be connected to the plurality of memory chips 202, 204, 206, and to the wirebond connection 402 by an internal data bus 314 in order to send and receive data between the plurality of memory chips 202, 204, 206. The parallel to serial conversion module 308 may include a shift register which may modify the format of data inputs from the plurality of memory chips 202, 204, 206 from parallel to serial.

The data retrieval connection 312 may be a soldered pin, wirebond connection, solder bump/pad, or other suitable type of connection. The data retrieval connection 312 may be a separate electrical connection from connections included within the stacked memory device 106. In embodiments, the data retrieval connection 312 may be used to retrieve data from the plurality of memory chips in the event of an error condition in the primary control chip 108. In certain embodiments, the data retrieval connection 312 may include two or more connections. For example the data retrieval connection 312 may include a data pin which transmits data in serial, and a clock pin which transmits the corresponding clock signal with the data transmission. In certain embodiments, the data retrieval connection 312 may be used in normal operations as well, to communicate in serial between the elements of the stacked memory device 106 and a computer system. The data retrieval connection 312 may be connected to the second external data bus 127 (FIG. 1) relative to the stacked memory device 106.

The parallel to serial conversion module 308, and serial interface 304 may be located in the secondary control chip 110 to improve likelihood of removal of data from the stacked memory device 106 in the event of failure of the primary control chip 108. For example, damage to components in the primary control chip 108 may impede transmission of data to the parallel to serial conversion module 306 and out through the data retrieval connection 312. By placing a parallel to serial conversion module 308 and serial interface 304 in the secondary control chip 110, data may be more reliably retrieved from the stacked memory device 106 in the event of primary control chip 108 failure.

Figure 5:
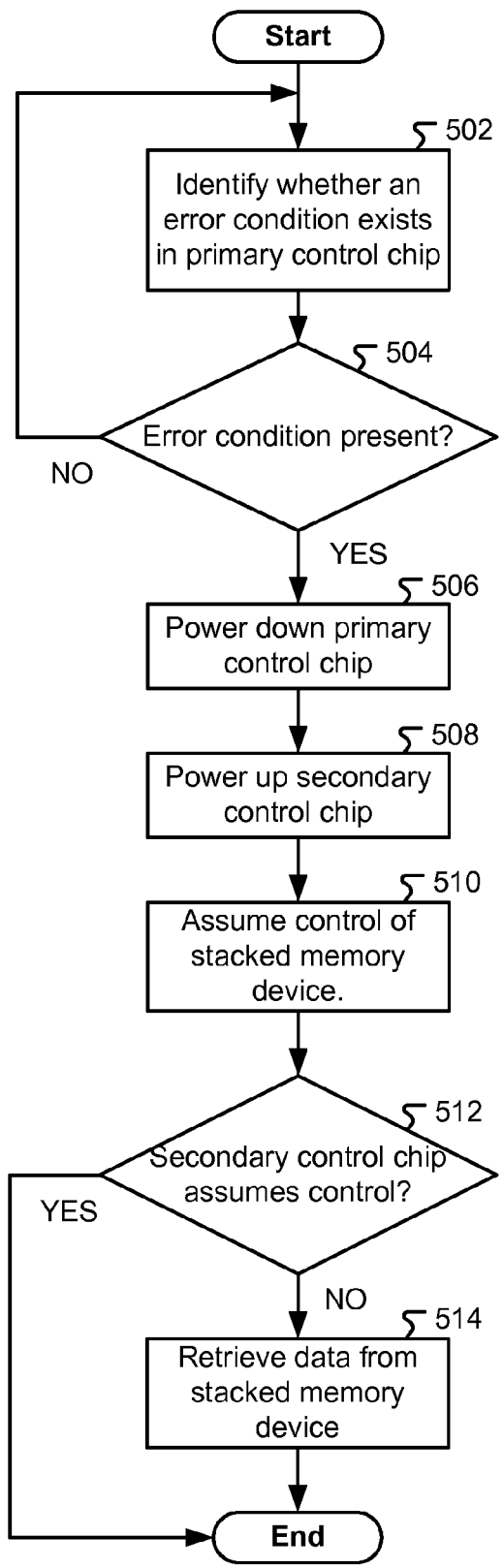
FIG. 5 depicts a flow diagram of a method of retrieving data from a stacked memory device according to various embodiments.

Referring now to FIG. 5 a flow diagram of a method of retrieving data from a stacked memory device may be seen according to embodiments of the present disclosure. In operation 502, a computer implementing the method may determine whether an error condition exists in the primary control chip. The error condition may be the same or substantially similar as described herein. The error condition may be multiple types of errors in the primary control chip 108 (FIG. 1). In embodiments, the error condition may be failure of hardware components in the primary control chip 108 such as buffers, drivers, solder bump failure, memory storage devices, logic arrays, or other components in the primary control chip 108. In certain embodiments, the error conditions may be caused by electro migration in the primary control chip 108, power failure to components in the primary control chip 108, or other failure which causes failure of the primary control chip 108 to execute a read or write command.

If an error condition is not present in the primary control chip then, from decision block 504, the method may reset to operation 502 and repeat until an error condition is detected. Once an error condition is present then, from decision block 504, the method may progress to operation 506. In embodiments, the primary control chip may be configured to determine whether a read or write command was executed properly, and in response to determining that the read or write command did not execute, signal to the memory controller that the error condition occurred in the primary control chip. In certain embodiments, the memory controller or the secondary control chip may also be configured to determine whether an error condition occurred in the primary control chip.

In operation 506, the primary control chip may be disabled. The primary control chip may rendered quiescent use power gating techniques to disable the primary control chip. Power gating techniques may include using header switches, such as a p-type transistor, and/or footer switches (such as an n-type transistor) to gate power off to logic latches in the primary control chip. In certain embodiments, power gating techniques may include disabling the clock signal to logic latches in the primary control chip. Other suitable power gating techniques may also be used. In certain embodiments the primary control chip may communicate with the memory controller and receive commands which commands the primary control chip to be enabled.

In operation 508, the secondary control chip may be enabled. The secondary control chip 110 (FIG. 1) may be communicatively connected to the memory controller. The secondary control chip may be enabled or disabled by communications from memory controller. The secondary control chip may be enabled using similar power gating techniques as described herein including header and footer switches and enabling the clock signal to logic latches in the secondary control chip. Other suitable methods of power gating techniques may also be used.

In operation 510 the secondary control chip may assume control functions of the stacked memory device. The secondary control chip may have backup logic or instructions to control the plurality of memory chips and to carry out functions of the stacked memory device in the event of failure or problems in the primary control chip. The secondary control chip may be configured to assume control of the stacked memory device after being enabled up.

In decision block 512, if the secondary control chip assumes control of the stacked memory device the method may end and operation of the stacked memory device may continue. The logic contained in the secondary control chip may provide a different level of functionality than the primary control chip. In certain embodiments, the secondary control chip may include the same logic as the primary control chip and may provide a similar level (or the same level) of functionality as the primary control chip. When the secondary control chip has the same logic capabilities as the primary control chip, the secondary control chip may act as a backup control chip for the stacked memory device which may provide control over one or more of the functions of the primary control chip. If the secondary control chip does not assume control of the stacked memory device then, in decision block 512, the method may progress to operation 514. The secondary control chip may contain insufficient logic to continue operation of the stacked memory device. If the secondary control chip cannot continue operation of the stacked memory device the secondary control chip may provide partial functionality for the plurality of memory chips so that data may be read from the plurality of memory chips.

In operation 514 data may be retrieved from the stacked memory device. The stacked memory device may have one or more electrical interconnects which may be used to read data out to a computer system. The one or more electrical interconnects may include a data interconnect and a clock interconnect. The data interconnect may transmit data out of the stacked memory device. The clock interconnect may transmit a clock signal corresponding to data transmitting out of the stacked memory device. The stacked memory device may have a parallel to serial conversion module which may convert data signals from the plurality of memory chips from parallel form to serial in order to transmit data on the data interconnect. The parallel to serial conversion module may be contained in the secondary control chip.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A method for accessing data stored in a stacked memory device, the method comprising:
   controlling a plurality of memory chips of the stacked memory device with logic or instructions implemented by a primary control chip;
   identifying an error condition in the primary control chip of the stacked memory device;
   disabling, in response to identifying the error condition in the primary control chip, the primary control chip using a memory controller coupled to the stacked memory device;
   enabling, in response to identifying the error condition in the primary control chip, a secondary control chip of the stacked memory device using the memory controller;
   in response to disabling the primary control chip, controlling the plurality of memory chips of the stacked memory device with logic or instructions implemented by the secondary control chip;
   retrieving data stored on the plurality of memory chips of the stacked memory device using the secondary control chip; and
   transmitting, to the memory controller, the data stored in the stacked memory device using a serial interface in the secondary control chip.

2. The method of claim 1, further comprising:
   retrieving data from the stacked memory device in response to determining that the secondary control chip contains insufficient logic to continue operation of the stacked memory device.

3. The method of claim 1, wherein retrieving the data stored on the stacked memory device using the secondary control chip comprises:
   executing read commands at the secondary control chip in order to read data out of the plurality of memory chips.

4. The method of claim 1, further comprising:
   executing write commands at the secondary control chip in order to write data into plurality of memory chips.

5. The method of claim 1, wherein the memory controller is configured to enable the secondary control chip after disabling the primary control chip in response to identifying the error condition in the primary control chip.

* * * * *